(12) United States Patent
Karnezos

(10) Patent No.: US 7,589,407 B2
(45) Date of Patent: Sep. 15, 2009

(54) SEMICONDUCTOR MULTIPACKAGE MODULE INCLUDING TAPE SUBSTRATE LAND GRID ARRAY PACKAGE STACKED OVER BALL GRID ARRAY PACKAGE

(75) Inventor: Marcos Karnezos, Palo Alto, CA (US)

(73) Assignee: Stats Chippac Ltd., Singapore (SG)

( * ) Notice: Subject to any disclaimer, the term of this patent is extended or adjusted under 35 U.S.C. 154(b) by 349 days.

(21) Appl. No.: 11/396,954

(22) Filed: Apr. 3, 2006

(65) Prior Publication Data

US 2006/0226536 A1  Oct. 12, 2006

Related U.S. Application Data

(60) Provisional application No. 60/669,975, filed on Apr. 11, 2005.

(51) Int. Cl.
*H01L 23/02* (2006.01)
(52) U.S. Cl. .................. 257/686; 257/712; 438/110
(58) Field of Classification Search .................. 257/706,
257/712, 685, 660, 659, 686, 717, 720, 701,
257/678; 438/106–108, 109
See application file for complete search history.

(56) References Cited

U.S. PATENT DOCUMENTS

| | | | | |
|---|---|---|---|---|
| 6,002,178 | A * | 12/1999 | Lin ............................. | 257/778 |
| 6,236,108 | B1 * | 5/2001 | Sota et al. .................... | 257/667 |
| 6,727,581 | B2 * | 4/2004 | Abe et al. .................... | 257/723 |
| 6,779,783 | B2 * | 8/2004 | Kung et al. .................. | 257/780 |
| 6,818,998 | B2 * | 11/2004 | Kwon et al. ................. | 257/777 |
| 6,977,439 | B2 * | 12/2005 | Kang et al. .................. | 257/777 |
| 7,138,296 | B2 * | 11/2006 | Sakamoto et al. ........... | 438/113 |
| 7,307,352 | B2 * | 12/2007 | Choi .......................... | 257/786 |
| 2001/0026010 | A1 * | 10/2001 | Horiuchi et al. ............. | 257/678 |
| 2001/0030122 | A1 | 10/2001 | Hara et al. | |
| 2002/0000327 | A1 * | 1/2002 | Juso et al. ................... | 174/250 |
| 2002/0039808 | A1 * | 4/2002 | Fukutomi et al. ........... | 438/106 |
| 2002/0056561 | A1 * | 5/2002 | Yaguchi et al. ............. | 174/52.1 |
| 2004/0063242 | A1 * | 4/2004 | Karnezos .................... | 438/106 |
| 2004/0124516 | A1 * | 7/2004 | Nakamura et al. .......... | 257/685 |
| 2004/0175861 | A1 * | 9/2004 | Eldridge et al. ............. | 438/106 |
| 2006/0138631 | A1 | 6/2006 | Tao et al. | |

* cited by examiner

*Primary Examiner*—W. David Coleman
*Assistant Examiner*—Su C Kim

(57) ABSTRACT

A single metal layer tape substrate includes a patterned metal layer affixed to a patterned dielectric layer. The dielectric layer is patterned to provide openings exposing lands and bond sites on bond fingers on the land side of the metal layer. The metal layer is patterned to provide circuit traces as appropriate for interconnection with the die (on the die attach side) and with other elements (such as other packages in a multi-package module). Interconnection with a die is made by wire bonding to exposed traces on a die attach side of the metal layer, and bond fingers and lands for access to testing the package are provided on the opposite (land) side of the metal layer. In some embodiments a row of wire bond sites on the land side of adjacent bond fingers is exposed by a common opening in the dielectric layer, providing for a finer pitch interconnect and, accordingly, a higher interconnect density between stacked packages. Also a land grid array package having such a single metal layer tape substrate. Also, a multi-package module including such a single metal layer tape substrate land grid array package stacked over a ball grid array package. Methods for making the substrate are also disclosed.

12 Claims, 5 Drawing Sheets

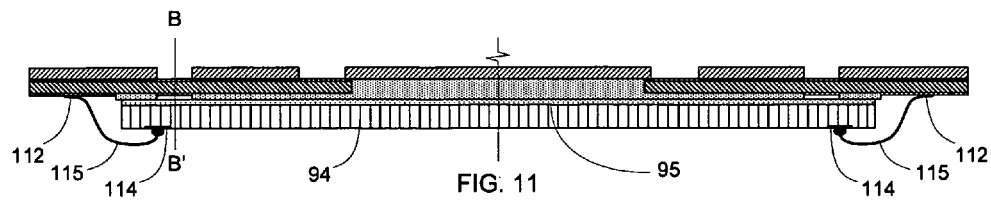
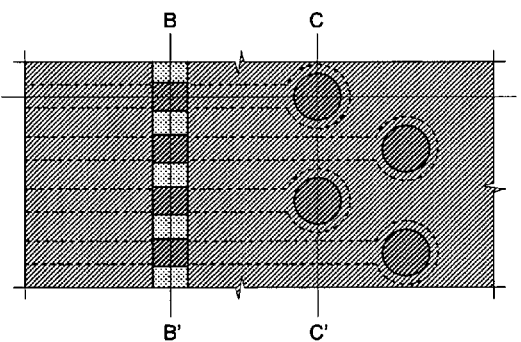
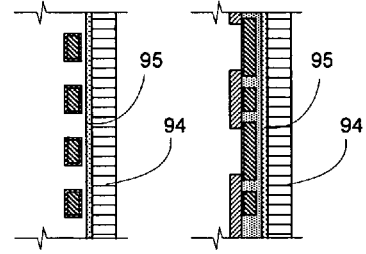
FIG. 12A  FIG. 12B  FIG. 12C
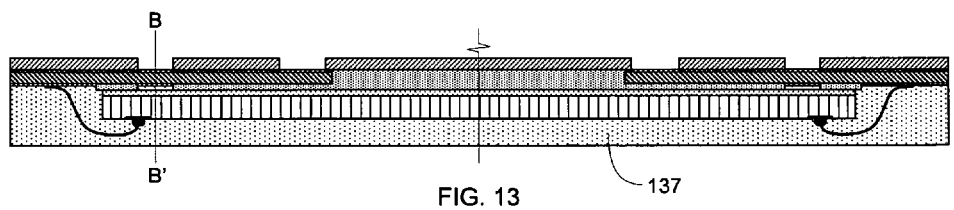
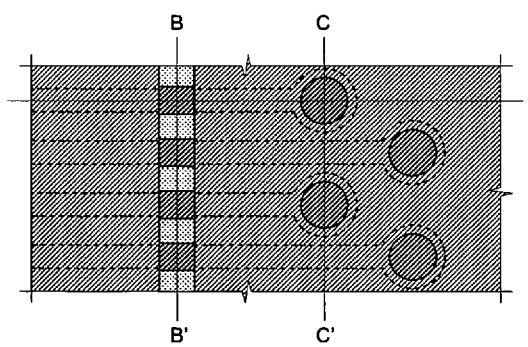
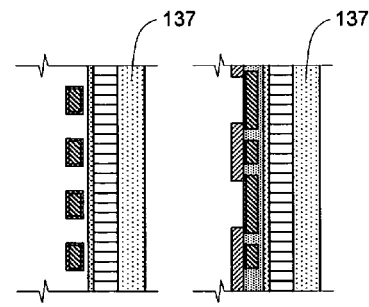
FIG. 14A  FIG. 14B  FIG. 14C

SEMICONDUCTOR MULTIPACKAGE MODULE INCLUDING TAPE SUBSTRATE LAND GRID ARRAY PACKAGE STACKED OVER BALL GRID ARRAY PACKAGE

CROSS-REFERENCE TO RELATED APPLICATION

This application claims priority from U.S. Provisional Application No. 60/669,975, filed Apr. 11, 2005, titled "Semiconductor multi-package module including tape substrate land grid array package stacked over ball grid array package", which is hereby incorporated by reference.

BACKGROUND

This invention relates to semiconductor chip packaging and, particularly, to packaging suitable for stacked package modules (such as package-in-package modules).

Semiconductor package substrates typically are laminates of two or more patterned metal layers separated by dielectric layers. Interconnection of the die (one or more, in a stacked die package) to the substrate is made to bond sites in traces in an uppermost metal layer. Interconnection of the package to a motherboard (for example) or to another package in a stacked package module (for example) is made to traces in a lowermost metal layer. Interconnection between upper and lower metal layers is made by vias, which are typically holes in the intervening dielectric layer or layers, filed with conductive material.

SUMMARY

In one general aspect the invention features a single metal layer tape substrate, and methods for making the single metal layer substrate. The substrate includes a patterned metal layer having a die attach side and a land side, affixed (for example, laminated) to a patterned dielectric layer. The patterned metal layer includes bond fingers and lands. The metal layer is patterned to provide circuit traces as appropriate for interconnection with the die (on the die attach side) and with other elements (such as other packages in a multi-package module). The dielectric layer is patterned to provide openings exposing bond sites on lands (and, optionally, exposing sites on bond fingers) on the land side of the metal layer. Interconnection of a die with the substrate is made by wire bonding to exposed traces on bond fingers on a die attach side of the metal layer. Lands (and, optionally) bond fingers are exposed on the land side of the metal layer for access to testing the package, and/or for attachment of second-level interconnection to underlying circuitry such as a motherboard. In some embodiments a row of wire bond sites on adjacent bond fingers is exposed on the land side by a common opening in the dielectric layer, providing for a finer pitch interconnect and, accordingly, a higher interconnect density between stacked packages.

In another general aspect the invention features a land grid array package, or a ball grid array package, having a single metal layer tape substrate. The package according to the invention can be made thinner than is possible in a package having a multiple metal layer laminate substrate. The improved thinness can be particularly useful in multi-package modules, as are used for example in wireless and consumer product applications. The package according to the invention can be particularly useful in multi-package modules having an upper inverted package stacked over a lower package.

In another general aspect the invention features a multipackage module including a single metal layer tape substrate land grid array package stacked over a ball grid array package. In some embodiments the ball grid array package has a single metal layer tape substrate. The land grid array package is inverted with respect to the lower ball grid array package, and interconnection between the single metal layer tape substrate land grid array package and the ball grid array package is made by wire bonds leading from the exposed wire bond sites on the land side of the land grid array package.

In another general aspect the invention features a method for making a single metal layer tape substrate, by providing a substrate dielectric layer, patterned to provide openings situated to expose bond finger sites and lands on a metal layer, laminating a metal foil such as a copper foil onto a surface of the dielectric layer, and patterning the metal foil to form bond fingers and lands over said openings. In some embodiments the dielectric layer is a polymer material and in some embodiments the openings are made by punching or etching. In some embodiments the metal foil is affixed to the surface of the dielectric layer using chromium or an adhesive. In some embodiments the method further includes plating exposed surfaces of the patterned foil with a metal. In some embodiments the method further includes applying a dielectric material on a die attach region of the side of the metal foil facing away from the dielectric layer to form a substrate assembly having a die attach side and a land side opposite the die attach side.

In another general aspect the invention features a method for making a semiconductor package by forming the single metal layer tape substrate assembly as described above, affixing a die onto a die mount surface of the die attach side of the substrate assembly; electrically connecting die pads with bond sites on the die attach side of the bond fingers by wire bonds; and encapsulating the die and wire bonds.

In some embodiments the dielectric material is applied to the substrate by supporting the substrate on the land side and printing the dielectric material onto the die attach side. In some embodiments the dielectric material is printed through a screen or stencil, and the surface of the dielectric material is planarized. In some embodiments the plating includes immersing the patterned laminated metal foil and dielectric layer in a plating bath, and in some embodiments the plating is repeated to form a plurality of plating layers, such as plating first with nickel and then with gold.

BRIEF DESCRIPTION OF THE DRAWINGS

FIG. 11 is a diagrammatic sketch in a sectional view showing a further stage in a process for making a single metal layer tape substrate according an embodiment to the invention.

FIG. 12A is a diagrammatic sketch in a plan view showing a portion of the embodiment of FIG. 11, viewing the land side of the substrate.

FIG. 12B is a diagrammatic sketch in a sectional view of the embodiment of FIG. 12A, taken thru B-B'.

FIG. 12C is a diagrammatic sketch in a sectional view of the embodiment of FIG. 12A, taken thru C-C'.

FIG. 13 is a diagrammatic sketch in a sectional view showing a further stage in a process for making a single metal layer tape substrate according an embodiment to the invention.

FIG. 14A is a diagrammatic sketch in a plan view showing a portion of the embodiment of FIG. 13, viewing the land side of the substrate.

FIG. 14B is a diagrammatic sketch in a sectional view of the embodiment of FIG. 14A, taken thru B-B'.

FIG. 14C is a diagrammatic sketch in a sectional view of the embodiment of FIG. 14A, taken thru C-C'.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly renumbered, although they are all readily identifiable in all the FIGS.

Figure 1:
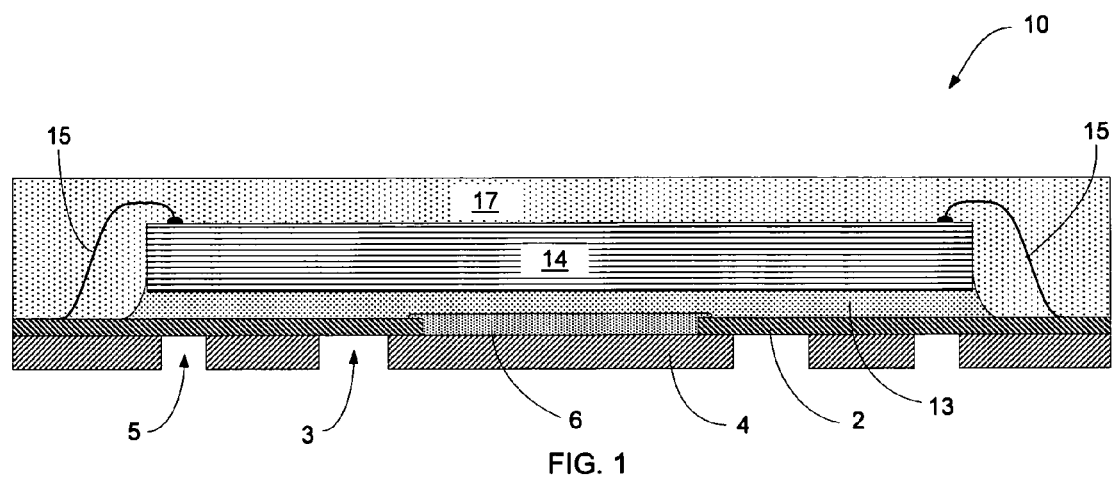
FIG. 1 is a diagrammatic sketch in a sectional view showing an embodiment of a single metal layer tape substrate land grid array package according to the invention.
Figure 2:
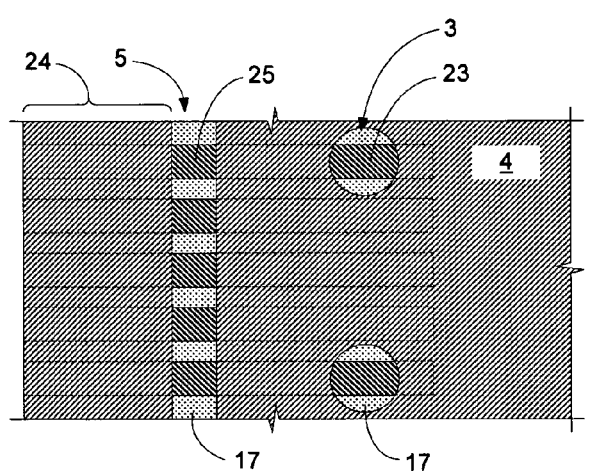
FIG. 2 is a diagrammatic sketch in a plan view showing a portion of the embodiment of FIG. 1, viewing the land side of the package.
Figure 3:
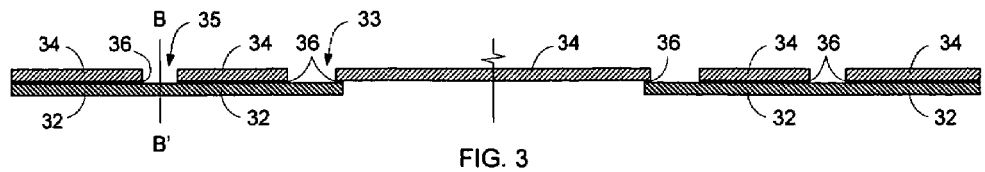
FIG. 3 is a diagrammatic sketch in a sectional view showing a stage in a process for making a single metal layer tape substrate according an embodiment to the invention.
Figure 4A:
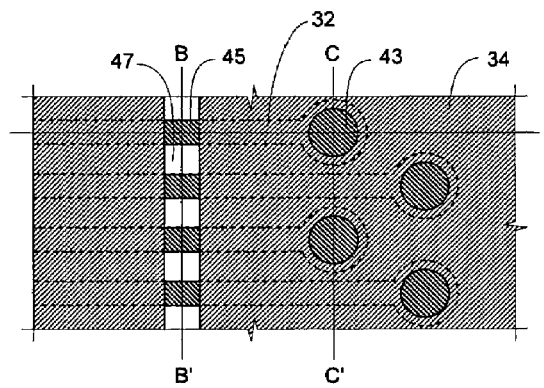
FIG. 4A is a diagrammatic sketch in a plan view showing a portion of the embodiment of FIG. 3, viewing the land side of the substrate.
Figure 4B:
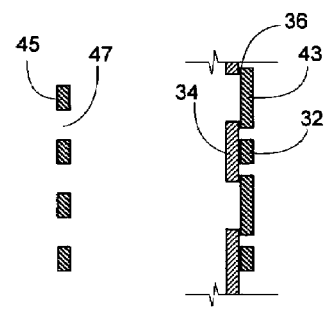
FIG. 4B is a diagrammatic sketch in a sectional view of the embodiment of FIG. 4A, taken thru B-B'.
Figure 4C:
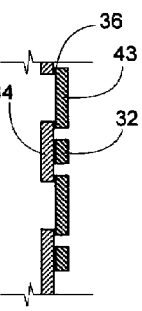
FIG. 4C is a diagrammatic sketch in a sectional view of the embodiment of FIG. 4A, taken thru C-C'.
Figure 5:
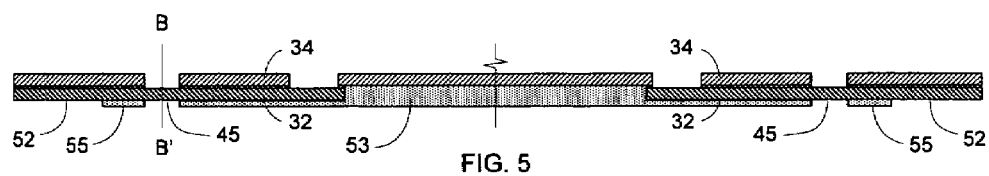
FIG. 5 is a diagrammatic sketch in a sectional view showing a further stage in a process for making a single metal layer tape substrate according an embodiment to the invention.
Figure 6A:
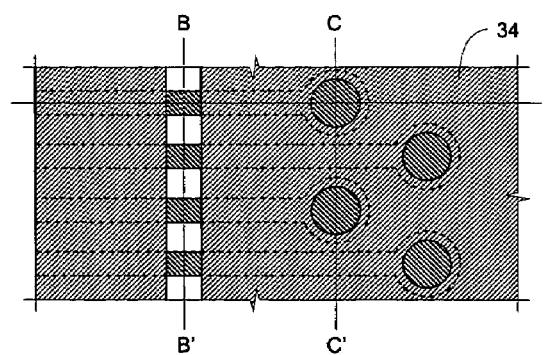
FIG. 6A is a diagrammatic sketch in a plan view showing a portion of the embodiment of FIG. 5, viewing the land side of the substrate.
Figure 6B:
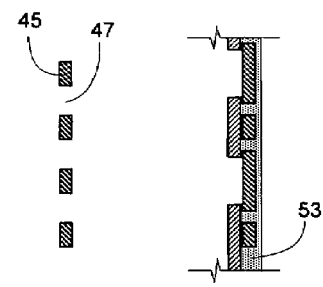
FIG. 6B is a diagrammatic sketch in a sectional view of the embodiment of FIG. 6A, taken thru B-B'.
Figure 6C:
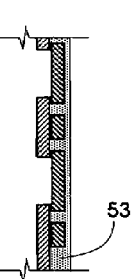
FIG. 6C is a diagrammatic sketch in a sectional view of the embodiment of FIG. 6A, taken thru C-C'.
Figure 7:
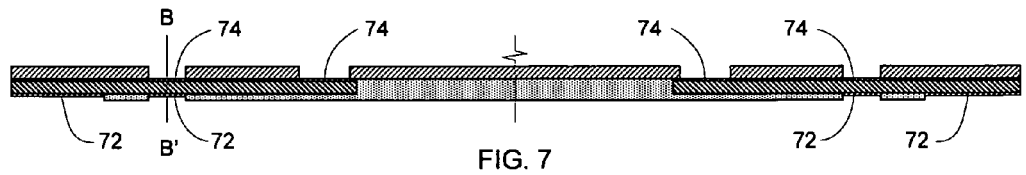
FIG. 7 is a diagrammatic sketch in a sectional view showing a further stage in a process for making a single metal layer tape substrate according an embodiment to the invention.
Figure 8A:
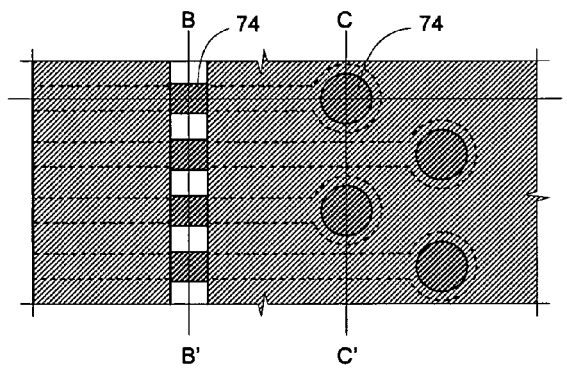
FIG. 8A is a diagrammatic sketch in a plan view showing a portion of the embodiment of FIG. 7, viewing the land side of the substrate.
Figure 8B:
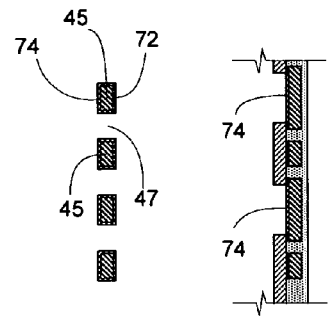
FIG. 8B is a diagrammatic sketch in a sectional view of the embodiment of FIG. 8A, taken thru B-B'.
Figure 8C:
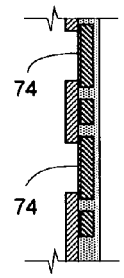
FIG. 8C is a diagrammatic sketch in a sectional view of the embodiment of FIG. 8A, taken thru C-C'.
Figure 9:
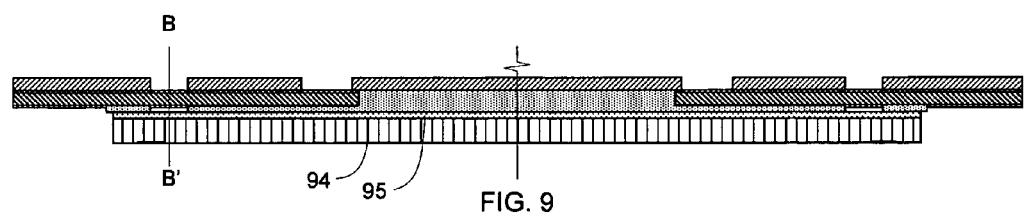
FIG. 9 is a diagrammatic sketch in a sectional view showing a further stage in a process for making a single metal layer tape substrate according an embodiment to the invention.
Figure 10A:
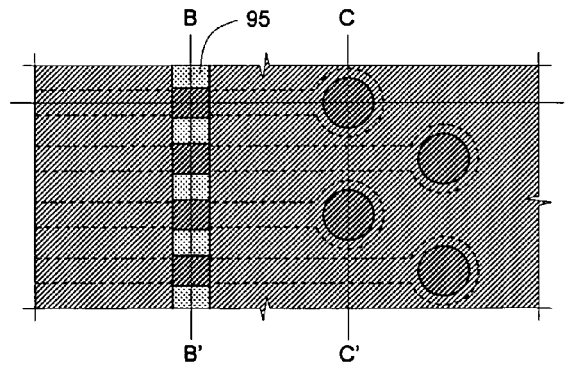
FIG. 10A is a diagrammatic sketch in a plan view showing a portion of the embodiment of FIG. 9, viewing the land side of the substrate.
Figure 10B:
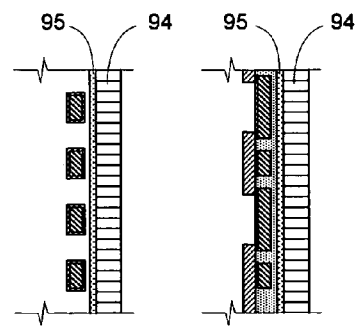
FIG. 10B is a diagrammatic sketch in a sectional view of the embodiment of FIG. 10A, taken thru B-B'.
Figure 10C:
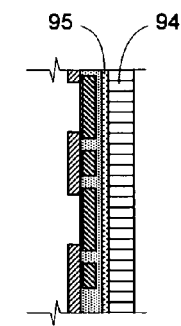
FIG. 10C is a diagrammatic sketch in a sectional view of the embodiment of FIG. 10A, taken thru C-C'.

Turning now to FIGS. 1 and 2, there is shown a semiconductor chip package 10 according to an embodiment of the invention, having one die wire bonded onto a single metal layer tape substrate. The substrate includes a dielectric layer 4 laminated with a patterned single metal layer 2. The metal layer 2 is patterned to provide traces as appropriate for making electrical connections between the substrate the die, on one side, and for making electrical connections from the package, on the other side. Intervals between the metal traces 2 can be planarized by filling, as shown at 6, with a dielectric material such as, for example a photoresist or film, to enable die attach without voids. A die 14 is affixed to the die attach side of the substrate using a die attach adhesive 13, such as a die attach epoxy or tape (film) adhesive. On the land side of the substrate (opposite the die attach side) openings 3 expose lands 23, and openings 5 expose bond fingers 25. The die 14 is electrically connected to selected traces on the die attach side by wire bonds 15. The die and wires are protected by an encapsulation or molding 17.

As FIG. 2 shows, according to one aspect of the invention an opening 5 in the dielectric layer 4 extends as a window across two or more the bond fingers 25. A marginal portion 25 of the dielectric layer 4 provides support for the margin of the patterned metal layer, including extensions of the bond fingers and including portions of the traces to which the wire bonds from the die are connected. Stated another way, a number of adjacent bond fingers 25 span a slot or window 5 in the dielectric layer 4. The substrate is typically rectangular (for example, generally square), and bond the bond sites on the bond fingers may be arranged in a row along one edge of the substrate, or in a row along each of two, three, or four edges of the substrate, as may be required for the particular die configuration. According to the invention, a slot or window 5 in the dielectric 4 may serve to expose all the bond sites in any such row. A slot or window configuration for opening to expose the bond sites on the bond fingers can be made to much finer specifications than individual openings for the sites.

The lands 23, which in the example shown are arranged more centrally (typically in an array) in the substrate, and typically opposite the die attach region, can be employed as sites for testing the land grid array package prior to combining it with other devices. For example, where the package is to be stacked over another package in a multi-package module, the package can be tested prior to assembly; packages not tested as "good" can be discarded and only "good" packages used in the assembly. This improves overall yield.

Various materials and dimensions may be specified for the single metal layer tape substrate land grid array package according to the invention, such as in the following illustrative example. The dielectric layer 4 can be a sheet of polyimide, patterned, for example by punching, to lay out the openings. The patterned polyimide film can have a thickness in the range, for example, about 25 um to about 75 um. The metal layer 2 can be a copper foil, laminated onto the polyimide film and then masked and etched to form the circuit traces. The patterned copper layer can have a thickness in the range, for example, about 12 um to about 25 um. At least the exposed portions of the metal layer can be plated, for example with nickel and gold, to provide superior electrical interconnection with wire bonds or with solder; the plating may have thicknesses, for example, about 5 um nickel and about 0.5 um gold. The planarizing layer may be, for example, a photoresist or other dielectric. A suitable planarizing material may be, for example, a dry film, which flows to some extent (plastic flow, that is, without melting) at raised temperature under pressure. The planarizing layer has a thickness at least about the same as the thickness of the metal layer, and the thickness may be in the range, for example, about 12 um to about 40 um. If the substrate is suitably planarized, a film adhesive may be used to attach the die; otherwise, a die attach epoxy should be employed. The die attach can have a thickness in the range, for example, about 20 um to about 75 um. The die thickness will depend upon the type of die; some die can have a thickness in the range, for example, about 75 um to about 150 um. The encapsulation or molding should have a thickness sufficient to cover the wires (allowing for variation in the loop height).

According to this aspect of the invention, the bond fingers may have a very fine pitch, as fine as the substrate manufacturing technology allows, and may be in some examples about 40 um or greater (as compared with about 80 um or greater for a multiple metal layer laminate substrate), and in the range, for example, about 40 um to about 400 um, as may be specified for a particular package. An stackable land grid array package according to the invention can have a very high interconnect density, so that chips, such as ASICs, having a high I/O count, can be packaged according to the invention and stacked over a lower package, which may be, for example, a processing unit. The lands may have a pitch in the range, for example, about 0.3 mm to 0.8 mm.

As noted above, the package according to the invention can be particularly useful in multi-package modules, such as so-called "package-in-package" (PIP) modules. In some such PIP modules, an upper package is inverted and stacked over a lower package, and the inverted upper package is electrically interconnected to the lower package by wire bonds connecting bond sites on bond fingers in the upward-facing side (the "land" side) of the upper package with bond sites on bond fingers on the upward-facing side of the lower package substrate. In some applications, such as hand held wireless devices (cellular phones having wireless internet communications capability, with imaging and sound capture capability, the device requires a signal processor, typically a digital signal processor, and an ASIC which may include graphics processing capability, in addition to memory. The ASIC typically has high I/O (for example 400); according to the invention, an ASIC can be packaged as single metal layer tape substrate land grid array with high I/O having a footprint smaller than the digital signal processor, and the ASIC package can be inverted and stacked over the digital signal processor package and interconnected with it by wire bonds. Memory can be provided as an additional memory package, included in the package stack (for example, stacked over the ASIC package); or memory can be included as stacked die in one or more of the stacked packages (for example, stacked with the ASIC die in the ASIC package).

FIGS. 3 through 14C are diagrammatic sketches showing stages in a process for making a single metal layer tape substrate, and a package having a die mounted on the tape, according to an embodiment of the invention. With reference now to FIGS. 3, 4A, 4B, and 4C, a substrate dielectric layer 34 is provided, patterned to provide openings 33, 35 situated to expose bond finger sites 45 and lands 43 on the land side of the metal layer. The dielectric layer may be formed from a sheet of a polymer material, such as a polyimide, and the openings may be made by punching or by etching. A metal foil, such as a copper foil, is then laminated onto a surface of the dielectric layer, using chromium or an adhesive as an affixative. The adhesive may have a thickness about 10 um to about 12 um, typically, for example. Then the metal foil is patterned by masking and etching to form the patterned traces 32, including lands 43, among other features, according to the circuit design. The result is shown in the FIGs. The affixative is shown at 36 in the FIGs., where the patterned metal foil 32 contacts the patterned polymer sheet 34. Because the opening 35 exposing the row of bond sites 45 on the bond fingers extends across several adjacent bond finger traces 32, voids 47 appear between the traces at the bond sites 45.

A further stage in the process is shown in FIGS. 5, 6A, 6B, and 6C. Here, a dielectric material is applied in a patterned layer 53, 55 to planarize the substrate on the die attach side 52 of the metal layer 32. The dielectric material can be applied by supporting the substrate on the substrate dielectric 34 side (the "land" side) and then printing the planarizing dielectric onto the opposite side (the die attach side) through a screen or stencil, using a doctor blade to level the surface of the planarizing dielectric. The planarizing dielectric layer is patterned to leave open the window in the substrate dielectric over the row of bond finger sites, and to leave exposed a marginal part of the bond fingers on the die attach side of the metal foil.

FIGS. 7, 8A, 8B, and 8C show a further stage in the process. Here, the assembly as shown in FIGS. 5, 6A, 6B, and 6C has been immersed in a plating bath, first to plate exposed surfaces of the patterned copper foil with nickel, and then to plate the nickel-plated surfaces with gold. In the FIGs., the Ni—Au plated areas on the die attach side of the metal foil are shown at 72, and the Ni—Au plated areas on the land side of the metal foil are shown at 74. The planarizing dielectric serves as a plating mask on the die attach side of the substrate, and the substrate dielectric serves as a plating mask on the land side of the substrate. Because of the voids between the bond fingers at the window exposing the bond sites, the bond fingers are plated on all sides at these points.

A further stage in the process is shown in FIGS. 9, 10A, 10B, and 10C, following die attach onto the substrate. In the example shown here, a film adhesive 95 is employed to affix the die 94 onto the substrate. At this stage, when the assembly is viewed from the land side, the voids are blocked by the film adhesive 95. Elsewhere on the die attach side of the substrate, the planarization later provides a firm and substantially flat platform for the die attach film adhesive.

In the stage of the process shown in FIGS. 11, 12A, 12B, and 12C, wire bonds 115 have been formed to connect the bond pads 114 on the die 94 with the die attach surface 112 of the bond fingers. In the stage of the process shown in FIGS. 13, 14A, 14B, and 14C, the assembly has been molded (or encapsulated) with a molding 137 which encloses the die and the wire bonds, completing the package.

Figure 15:
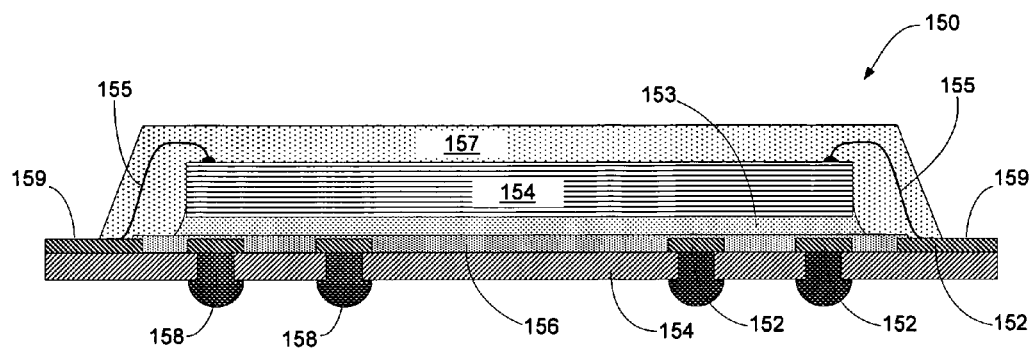
FIG. 15 is a diagrammatic sketch in a sectional view showing an embodiment of a single metal layer tape substrate ball grid array package according to the invention.

The description above refers by way of example to a land grid array package. As shown in FIG. 15, a single metal layer tape substrate package according to the invention can be configured as a ball grid array package. Reference is made to FIG. 1. The ball grid array package 150 of FIG. 15 can be constructed in much the same way as the land grid array package described above. The substrate includes a patterned dielectric layer 154 laminated with a single metal layer 152. The die 154 is attached using a die attach adhesive 153, and is interconnected with the bond fingers on the substrate by wire bonds 155. Here, however, the bond fingers are exposed on the die attach side 159, but are not exposed on the opposite side. The package is necessarily molded, so that the bond fingers 159 are not covered on the die attach side by the molding 157. And here the patterned dielectric layer 154 is patterned to expose module solder ball attach pads 152. After completion of steps generally as outlined in FIGS. 3 through 12C, the package is molded, and then solder balls or bumps 158 are formed in the openings in the substrate dielectric 154, to make connection with the pads 152.

Figure 16:
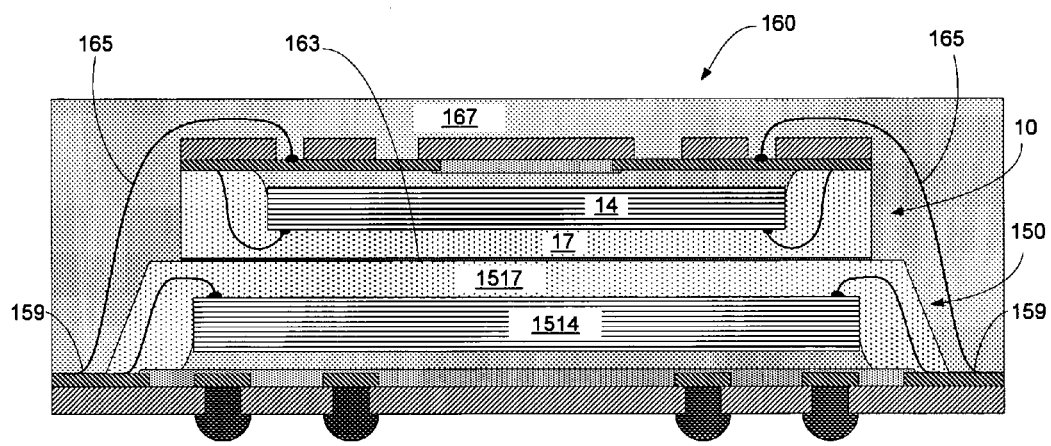
FIG. 16 is a diagrammatic sketch in a sectional view showing an embodiment of a multi-package module according to the invention, having an inverted single metal layer tape substrate land grid array package stacked over a single metal layer tape substrate ball grid array package.

FIG. 16 shows, generally at 160, a multi-package module (PIP) according to the invention. In this example, both the lower ball grid array package 150 and the inverted upper land grid array package 10 are single metal layer tape substrate packages. The inverted upper land grid array package is affixed to the molding of the lower ball grid array package using an adhesive 163. The upper and lower packages are electrically interconnected by wire bonds 165 which connect bond sites on the bond fingers of the upper package 10 with bond sites 159 on the bond fingers of the lower package 150. The module is encapsulated or molded, s shown at 167.

Other embodiments are within the scope of the invention.

What is claimed is:

1. A semiconductor package comprising:
    a land grid array package with a single metal layer substrate further comprising:
        a patterned dielectric layer,
        a patterned metal layer affixed to the patterned dielectric layer, the patterned metal layer having a land side facing the dielectric layer and a die attach side opposite the land side,
        circuit traces of the patterned metal layer for interconnection with a die on the die attach side, the circuit traces including bond fingers and lands, and
        an opening of the patterned metal layer for exposing bond sites on lands on the land side of the metal layer;
    the land grid array package inverted and stacked on a ball grid array package; and
    wire bonds leading from exposed bond sites on the land side of the land grid array package for z-interconnection.

2. The single metal layer substrate of claim 1 wherein the dielectric layer has openings additionally exposing sites on bond fingers on the land side of the metal layer.

3. The single metal layer substrate of claim 2 wherein the opening exposing bond sites on bond fingers on the land side of the metal layer exposes a plurality of the bond sites.

4. The single metal layer substrate of claim 3 wherein the opening exposing bond sites on bond fingers on the land side of the metal layer comprises a slot.

5. The single metal layer substrate of claim 4 wherein a plurality of bond fingers traverses the slot.

6. The land grid array package, comprising a die mounted onto a die attach side of a single metal layer substrate of claim 1.

7. The land grid array package, comprising a die mounted onto a die attach side of a single metal layer substrate of claim 2.

8. The ball grid array package, comprising a die mounted onto a die attach side of a single metal layer substrate of claim 1, and second level interconnects mounted at bond sites on the land side of the metal layer.

9. The ball grid array package, comprising a die mounted onto a die attach side of a single metal layer substrate of claim 2, and second level interconnects mounted at bond sites on the land side of the metal layer.

10. The semiconductor package of claim 1 wherein the ball grid array package is a single metal layer ball grid array package.

11. An electronic device, comprising a package having a single metal layer tape substrate as in claim 1, electrically connected to circuitry in the device.

12. An electronic device, comprising a multi-package module including a package having a single metal layer tape substrate as in claim 1, the module being electrically connected to circuitry in the device.

* * * * *